United States Patent
Eskildsen

(10) Patent No.: US 6,605,875 B2
(45) Date of Patent: Aug. 12, 2003

(54) INTEGRATED CIRCUIT DIE HAVING BOND PADS NEAR ADJACENT SIDES TO ALLOW STACKING OF DICE WITHOUT REGARD TO DICE SIZE

(75) Inventor: Steven R. Eskildsen, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,451

(22) Filed: Dec. 30, 1999

(65) Prior Publication Data
US 2003/0102567 A1 Jun. 5, 2003

(51) Int. Cl.[7] ............................................. H01L 23/48
(52) U.S. Cl. ..................... 257/777; 257/786; 257/723
(58) Field of Search ............................. 257/784, 777, 257/723, 786; 361/716, 729, 735, 790

(56) References Cited

U.S. PATENT DOCUMENTS

| 5,177,669 A | | 1/1993 | Juskey et al. ............... 257/675 |
| 5,216,283 A | | 6/1993 | Lin .............................. 257/787 |
| 5,229,960 A | * | 7/1993 | De Givry ..................... 365/63 |
| 5,239,447 A | * | 8/1993 | Cotues et al. ............... 361/744 |
| 5,366,933 A | | 11/1994 | Golwalkar et al. .......... 437/215 |
| 5,373,189 A | * | 12/1994 | Massit et al. ................ 257/686 |
| 5,422,435 A | | 6/1995 | Takiar et al. ............... 174/52.4 |
| 5,614,766 A | * | 3/1997 | Takasu et al. ............... 257/777 |
| 5,633,530 A | * | 5/1997 | Hsu ............................. 257/685 |
| 5,777,345 A | | 7/1998 | Loder et al. ................ 257/777 |
| 5,780,925 A | * | 7/1998 | Cipolla et al. ............... 257/676 |
| 5,973,403 A | * | 10/1999 | Wark ........................... 257/777 |
| 5,998,864 A | * | 12/1999 | Khandros et al. ........... 257/723 |
| 6,133,637 A | * | 10/2000 | Hikita et al. ................ 257/777 |

FOREIGN PATENT DOCUMENTS

| EP | 0 782 191 A | 7/1997 |
| JP | 3-165550 | 7/1991 |
| JP | 4-99056 | 3/1992 |

* cited by examiner

Primary Examiner—Kamand Cuneo
Assistant Examiner—Lourdes Cruz
(74) Attorney, Agent, or Firm—Blakely, Sokoloff, Taylor & Zafman LLP

(57) ABSTRACT

Integrated circuit die having bond pads near adjacent sides to allow stacking of dice without regard to dice size. A lower die has keep out areas on its top surface. The keep out areas correspond to two adjacent edges of the lower die. The lower die has bond pads within the keep out areas. An upper die is stacked on the top surface of the lower die such that the bond pads within the keep out areas of the lower die are exposed to accept wire bonds. The configuration of the keep out areas next to adjacent edges of the lower die thus provides flexibility in the design of stacked chip packages because the size of the upper die is not limited by the bond pad configuration of the lower die.

11 Claims, 6 Drawing Sheets

INTEGRATED CIRCUIT DIE HAVING BOND PADS NEAR ADJACENT SIDES TO ALLOW STACKING OF DICE WITHOUT REGARD TO DICE SIZE

FIELD OF THE INVENTION

The present invention relates generally to integrated circuits and, in particular, to the packaging of integrated circuits.

BACKGROUND OF THE INVENTION

Electronic devices such as cellular telephones and notebook computers typically contain a number of integrated circuit (IC) packages mounted to a printed circuit board (PCB). IC packages typically include a single IC die (or chip) on a substrate or leadframe. The die and substrate are encapsulated in a material such as plastic. The encapsulated packages are then mounted to another substrate such as a PCB.

Multichip modules (MCM) are IC packages that can contain two or more integrated circuits. The size of the electronic device that uses MCMs can be reduced because MCMs typically have a number of individual IC dice mounted within a single package in a laterally adjacent manner. The outer dimensions of all the individual elements limit the minimum footprint of a multichip module, however. Moreover, multichip module substrates are typically constructed from ceramic, silicon, metal or printed circuit board materials that are relatively expensive to produce. Considerable effort has been expended to provide an electronic package that has a minimal footprint and volume and that can be assembled with conventional plastic injection molding techniques without adding expensive interconnecting substrate components.

FIG. 1 shows another type of IC package configuration that attempts to decrease the footprint and volume of the IC package. This type of IC package is known as a Stacked Chip Scale Package (SCSP). IC package 100 includes stacked IC dice. The SCSPs 101 are formed by stacking several sets of IC dice on a long substrate, wire bonding, encapsulating the IC dice, and then slicing the substrate and encapsulant to separate each SCSP 101.

Substrate 110 includes bond fingers 112 connected to conductive traces 114 on the top surface of the substrate 110. Bond fingers 112 are conductive areas on the substrate 110 that provide locations for wire bonding of the IC dice to the substrate 110. Vias 116 are conductive interconnects that extend through the substrate 110 to electrically connect traces 114 to conductive pads 117 on the bottom surface of the substrate 110. One example of a substrate is a printed circuit board (PCP). Other examples of materials for substrate 110 are: FR4, BT, tape automated bonding (TAB) tape material, ceramic, silicon on sapphire (SOS), or a multi-layered substrate such as OLGA.

The SCSP 101 shown in FIG. 1 is connected to a circuit board (not shown) by solder balls 118, which are placed on pads 117 on the bottom surface of the substrate 110. Other types of IC packages may include leads that extend laterally with respect to the dice within the package for connection to an external circuit board.

FIG. 1 also shows a first die 120 mounted to substrate 110. Second die 130 is mounted on the top surface of first die 120. An adhesive 103 such as epoxy is used to mount the die. After first die 120 and second die 130 are mounted, they are wire bonded to the substrate 110. First die 120 has bond pads 122 on its top surface near its edges, and second die 130 has bond pads 132 on its top surface near its edges. Bond wires 124 connect bond pads 122 of first die 120 to the substrate 110, while bond wires 134 connect bond pads 132 of second die 130 to the substrate 110.

FIG. 2 shows a top view of IC package 100 after wire bonding and before encapsulation. First die 120 is mounted to substrate 110. Bond pads 122 are connected by bond wires 124 to bond fingers 112. Second die 130 is mounted on top of first die 130. Bond pads 132 on second die 130 are connected to bond fingers 112 by bond wires 134. The area in the center of first die 120 limits the size of second die 130 because second die 130 cannot cover bond pads 122 of first die 120. This is especially problematic in dice having bond pads adjacent all four edges.

FIG. 3A shows an IC die configuration 200 that includes a first die 220 and a second die 230 stacked on top of first die 220. First and second dice 220 and 230 are stacked on substrate 210. Substrate 210 has bond fingers 212 adjacent two opposite ends, as shown in FIG. 2. Bond fingers 212 correspond to bond pads on first and second dice.

First die 220 has bond pads 222 adjacent two opposite edges rather than adjacent all four edges as in the first die 120 of FIG. 2. In order for second die 230 to be stacked on top of first die 220, second die 230 must fit between bond pads 222 of first die 220. Thus, the size of second die 230 is limited by the bond pad configuration on the first die 220.

FIG. 3B shows an IC die configuration 200' that includes a first die 220' and a second die 230' stacked on top of first die 220'. First and second dice 220' and 230' are rectangular and have bond pads 222' and 232', respectively, near opposing short edges. Die configuration 200' allows two dice that are the same size to be stacked and yet leave the bond pads of the lower die exposed, but these rectangular dice must be stacked with their respective axes perpendicular. Also, the second die 230' must be narrow enough to fit between the bond pads 222' of the first die 220'. The size of the second die 230' is therefore limited.

SUMMARY OF THE INVENTION

In one embodiment, an apparatus includes a lower die having a top surface and two adjacent keep out areas on the top surface. The keep out areas are next to two adjacent edges of the lower die. The lower die further includes at least one non-bonding edge area. An upper die is stacked on the lower die such that the two adjacent keep out areas are exposed to accept wire bonds.

Other features and advantages of the present invention will be apparent from the accompanying drawings and from the detailed description that follows below.

BRIEF DESCRIPTION OF THE DRAWINGS

The present invention is illustrated by way of example, and not limitation, in the figures of the accompanying drawings in which.

DETAILED DESCRIPTION

The following description includes terms, such as upper, lower, first, second, etc. that are used for descriptive purposes only and are not to be construed as limiting. The embodiments of an apparatus described herein can be manufactured, used, or shipped in a number of positions or orientations.

Various embodiments of integrated circuit (IC) packages that include at least two IC dice provide flexibility in the design of IC packages because of a unique bond pad configuration that allows greater choice in the sizes of the dice to be stacked. The dice of the embodiments described herein are stacked vertically on a substrate. The bond pads of the IC dice of these embodiments are distributed next to adjacent edges of the IC die. When an upper die is stacked on a lower die, the upper die is offset slightly from the bottom die so that the bond pads on the bottom die are exposed. The bond pads of the bottom die that are exposed can be easily connected to the substrate by conventional wire bonding techniques.

In one embodiment, an apparatus includes a lower die that has keep out areas on its top surface. The keep out areas are next to only two adjacent edges of the lower die. The lower die has bond pads only within the keep out areas. The apparatus also includes an upper die stacked on the top surface of the lower die. The upper die is positioned on the lower die to avoid the keep out areas of lower die. In one embodiment, the upper die is shifted diagonally with respect to the lower die to avoid the keep out areas. The bond pads of the lower die are exposed to accept bond wires.

Figure 1:
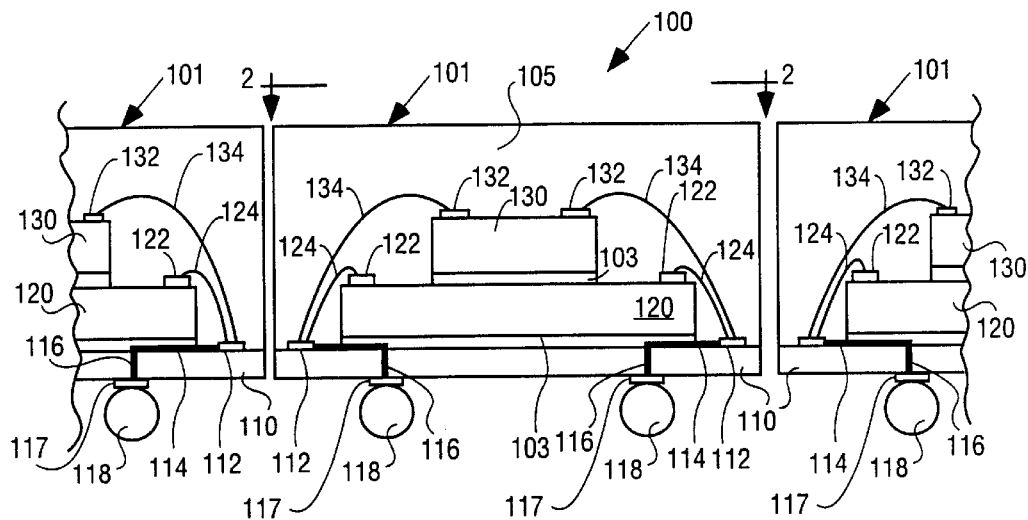
FIG. 1 is a side cross-sectional view of an integrated circuit package of the prior art.

The adjacent edge bond pad distribution, as further described below, allows mixing and matching of dice that are to be stacked in IC package without regard to the size of die. For instance, a smaller lower die can be used, or a larger upper die can be used than would be physically possible in a stacked configuration of a packaged such as shown in FIG. 1. A larger die can be used within a particular sized package, or smaller die can be used, thus decreasing the overall volume or footprint of the package. The almost unlimited ability to mix and match dice will allow the combination of new sets of dice to implement new product functionality.

Examples of IC packages that could implement such a stacked dice configuration are Flash memory packages that include Static Random Access Memory (SRAM) dice or a combination of dice of different memory technologies. Odd combinations of memory dice could also be provided. For example, a 16-megabyte RAM die could be stacked onto a 32-megabyte RAM die to provide a 48-megabyte RAM package. Also, IC dice having logic circuitry could be combined with memory dice in the same package. The increased flexibility of dice combinations provided by the bond pad and die-stacking configuration described herein can provide many types of electronic devices without the limitations currently associated with incompatible die sizes.

Figure 4:
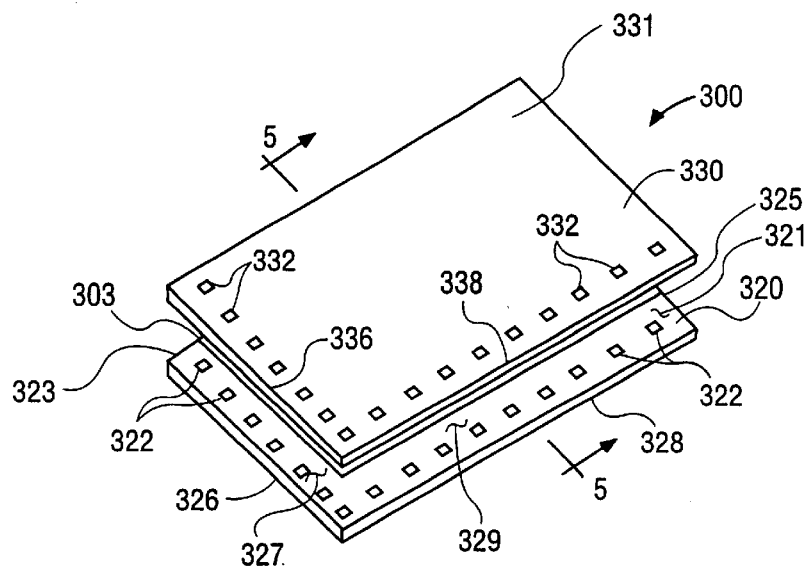
FIG. 4 is a perspective view of an embodiment of an integrated circuit package having stacked integrated circuit dice with bond pads adjacent two adjacent edges.

FIG. 4 shows an embodiment of an IC package 300 that includes stacked IC die. Lower die 320 includes bond pads 322 adjacent first edge 326 and second edge 328. First edge 326 is adjacent second edge 328. First and second edges 326 and 328 are considered bonding edges because bond pads 322 that are to be used to wire bond lower die 320 to a substrate (not shown) are located near first edge 326 and second edge 328.

Figure 4A:
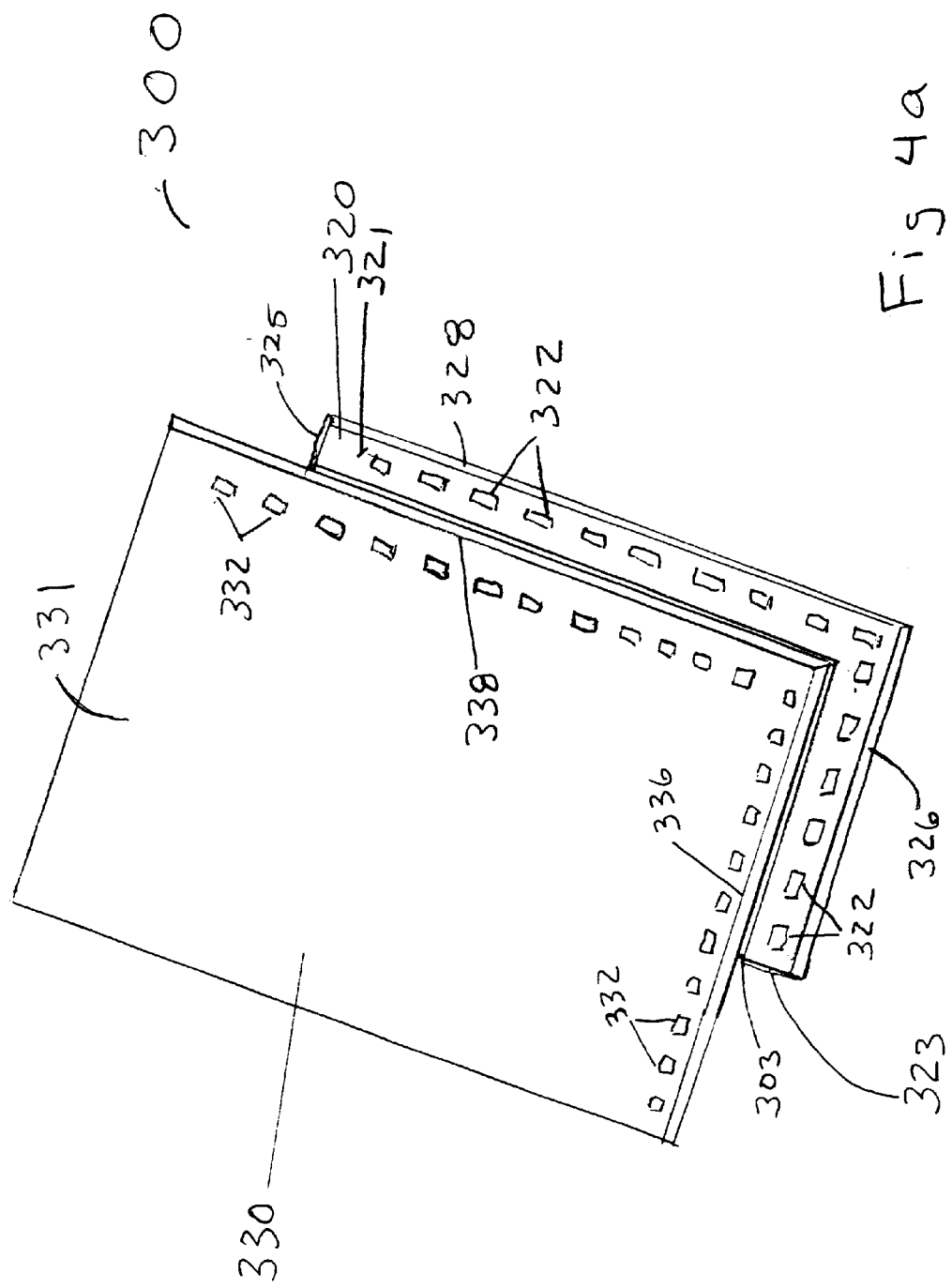
FIG. 4A is a perspective view of an embodiment of an integrated circuit package having stacked integrated circuit dice with bond pads adjacent two adjacent edges, in which the upper die is larger than the lower die.

Upper die 330 is stacked on lower die 320, as shown in FIG. 4. Preferably, upper die 320 is attached to top surface 321 of lower die 320 with an adhesive 303 such as epoxy. Upper die 330 is stacked or positioned on lower die 320 such that bond pads 322 are exposed and available for wire bonding. As shown in FIG. 4, upper die 330 is offset or shifted diagonally with respect to lower die 320. In this offset stacked configuration, upper die 330 can be the same size or larger (as shown in FIG. 4a) than lower die 320 and can be stacked onto lower die 320 without covering or overlapping bond pads 322 of lower die 320.

Upper die 330 includes bond pads 332. As show in FIG. 4 bond pads 332 of upper die of 330 are distributed near first edge 336 and second edge 338 of upper die 330. First edge 336 and second edge 338 of upper die 330 are adjacent each other. Bond pads 332 are on top surface 331 and are near first edge 336 and second edge 338. First edge 326 and second edge 328 of lower die 320, and similarly first edge 336 and second edge 338 of upper die 330, can be referred to as bonding edges. As shown in FIG. 4, the bonding edges of the lower die 320 are adjacent to each other and the bonding edges of the upper die are adjacent to each other. Preferably upper die 330 is positioned on the lower die 320 such that the bonding edges 336 and 338 are oriented toward the bonding edges 326 and 328, respectively, of lower die 320.

Because of the distribution of the bond pads 322 near adjacent edges of the lower die 320, upper die 330 can be sized to cover substantially all of the top surface 321 of the lower die except for areas surrounding bond pads 320, as further described below. While it is not required that upper die 330 cover substantially all the top surface of the lower die 320 except keep out areas, upper die can be larger than the lower die 320 in at least one horizontal direction. As shown in FIG. 4, a portion of upper die 330 overhangs the lower die 322 along third edge 323 and fourth edge 325 of lower die 320. Third and fourth edges 323 and 325 can also be referred to as non-bonding edges because lower die 320 does not include bond pads that will be wire bonded near or adjacent third and fourth edges 323 and 325.

The IC package of FIG. 4 could also included a second upper die (not shown). A second upper die would be stacked on the top surface 331 of the upper die 330 in a manner similar to that of the upper die 330 stacked on the lower die 320. Space and thermal considerations should be considered; however, there potentially is no limit to the number of die that can be stacked in this manner. Also, other IC packaging features can be incorporated into a package that includes offset stacked die such as those shown in FIG. 4. For example, a heat slug can be provided within the package to remove heat from either of the dice.

Figure 5A:
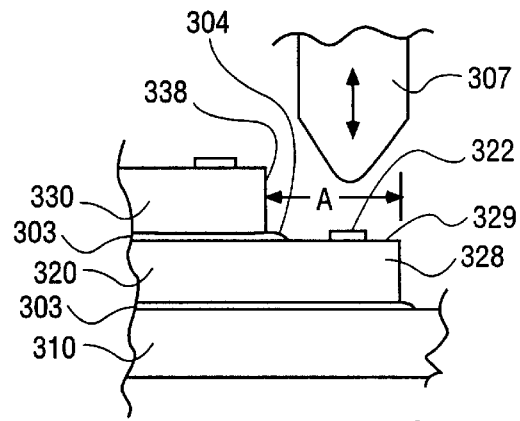
FIG. 5a is an enlarged, partial, cross sectional view of the embodiment shown in FIG. 5.
Figure 5:
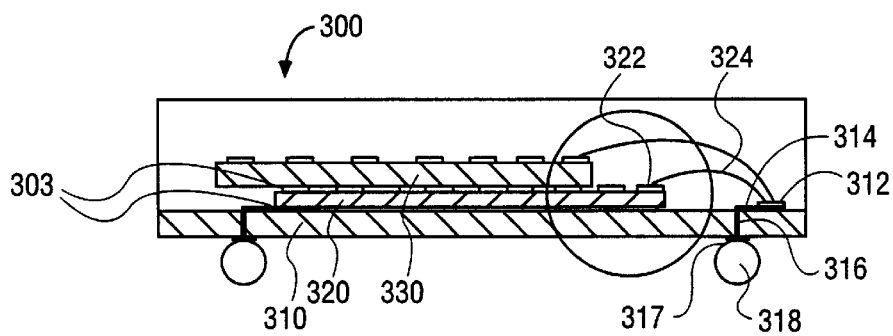
FIG. 5 is a cross sectional side view of the embodiment of FIG. 4.

FIGS. 5 and 5a show a cross sectional side view of the IC package 300. FIG. 5 shows a substrate 310 such as a PC board (PCB) that has bond fingers 312 traces 314 and vias 316. Vias 316 connect traces 314 and bond fingers 312 to pads 317 on the bottom surface of the substrate 310. Solder balls 318 can be provided on pads 317 for connection to another circuit board (not shown). Alternatively, IC package 300 can include a leadframe (not shown) having a die paddle such as is commonly used in quad flat pack (QFP) packages. In order to accommodate a stacked die configuration, a leadframe may need to be specially designed to accommodate multiple stacked IC dice.

FIG. 5 also shows lower die 320 mounted to substrate 310. Upper die 330 is offset and stacked on lower die 320. Adhesive 303 such as an epoxy is used to attach lower die 320 to substrate 310 and also to attach upper die 330 to lower die 320. The offset position of upper die 330 exposes bond pads 322 on lower die 320 so that lower die 320 can be electrically connected via bond wires 324 to the substrate 310. Bond wire 324 connects bond pad 322 to bond finger 312.

FIG. 5a shows keep out area 329. Keep out area is defined by the distance A between second edge 328 of lower die 320 and second edge 338 of upper die 330. Keep out area is the parameter that dictates the positioning of upper die 330 on lower die 320. Enough clearance must be provided to allow wire bonder 307 to attach a conductive bonding wire to bond pad 322 on lower die 320. Also, keep out area 329 is determined by the tolerance associated with mounting upper die 330 onto lower die 320. Also, adhesive 303 can exhibit bleed out 304 past the edge of 338 of upper die 330 when upper die is pressed on to lower die 320. Keep out area 329 (dimension A) thus takes into account bleed out 304, tolerances, and the width and size of the die attach or wire bonding tool 307.

Figure 6:
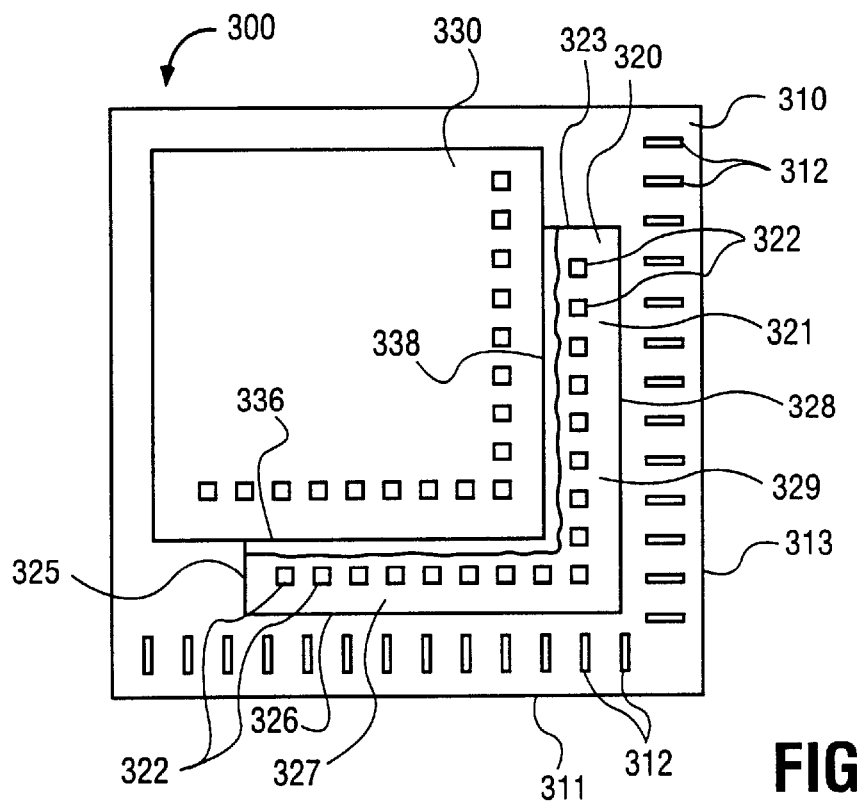
FIG. 6 is a top plan view of the stacked dice of FIG. 4 mounted on a substrate.

FIG. 6 shows IC package 300 having a lower die 320 and upper die 330 stacked in the offset manner previously described. Stacked die 320 and upper die 330 are mounted onto substrate 310. Substrate 310 has bond fingers 312 arranged next to adjacent edges of the substrate 310.

As shown in FIG. 6, lower die 320 has bond pads 322 on its top surface 321. Bond pads 322 are located near or adjacent to first edge 326 and second edge 328. Edges 326 and 328 are adjacent to each other. Edges 326 and 328 can be referred to as bonding edges while third edge 323 and fourth edge 325 are non-bonding edges. The bonding edges 326 and 328 have bond pads 322 adjacent thereto, while non-bonding edges 323 and 325 do not have bond pads adjacent them at all or have bond pads that are not to be wire bonded to bond fingers of substrate 310.

FIG. 6 shows keep out areas 327 and 329 that correspond only to the two adjacent edges 326 and 328 of the lower die 320. Lower die 320 has bond pads 322 only within the keep out areas 327 and 329. Upper die 330 is stacked on the top surface 321 of lower die 320 to avoid the keep out areas 327 and 329 such that the bond pads 322 of the lower die 320 are exposed to accept bond wires (not shown) for wire bonding to bond fingers 312.

Bond fingers 312 on substrate 310 correspond to bond pads 322 on lower die 320 when the lower die 320 is mounted on the substrate 310. By corresponding, it is meant that the bonding edges 326 and 328 are positioned adjacent the rows of bond fingers 312 along adjacent edges 311 and 313 of the substrate 310. The bond fingers 312 correspond positionally with bonding edges 326 and 328 and bond pads 322.

It should be noted that lower die 320 and upper die 330 could be part of a stack of more than two dice. For example, lower die 320 and upper die 330 could be mounted on another die (not shown) rather than a substrate 310 as shown in FIG. 6. Lower die 320 could be mounted on another die that has a bond pad configuration similar to that of lower die 320. Alternatively, lower die 320 could be mounted to the "back side" of another die, i.e. the side of a die opposite the side having bond pads.

Figure 2:
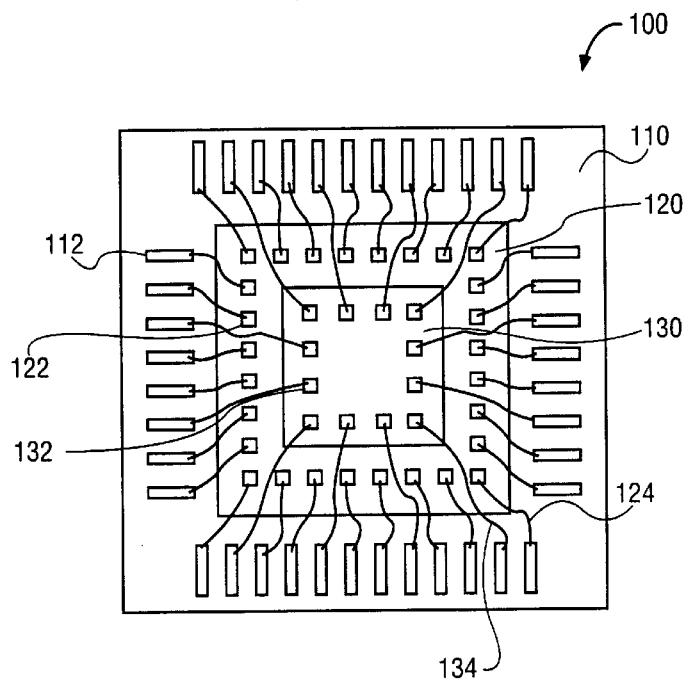
FIG. 2 is a top plan view of the prior art package of FIG. 1 taken along line 2—2 of FIG. 1.

Also, another die could be mounted onto upper die 330 in the same manner as upper die 330 is mounted onto lower die 320 in FIG. 6. Alternatively, another die could be mounted onto upper die 330 in a manner similar to that of second die 130 of FIGS. 1 and 2. IC dice with bond pads disposed near two adjacent edges of a substrate thus provide great flexibility in the design of IC package because the dice can be stacked without regard to relative die size.

Keep out areas 327 and 329 can also be referred to as bonding edge areas. Lower die 320 can have at least one non-bonding edge area (not shown) that is covered by upper die 330 when upper die 330 is stacked on lower die 320. The non-bonding edge areas are opposite the respective bonding edge areas of lower die 320. Upper die 330, in one embodiment, can be dimensioned to cover at least one of the non-bonding edge areas of the lower die 320 when stacked on lower die 320. The embodiment shown in FIG. 6 shows lower die 320 having two adjacent non-bonding edge areas (not shown) that are covered by upper die 330.

Figure 3A:
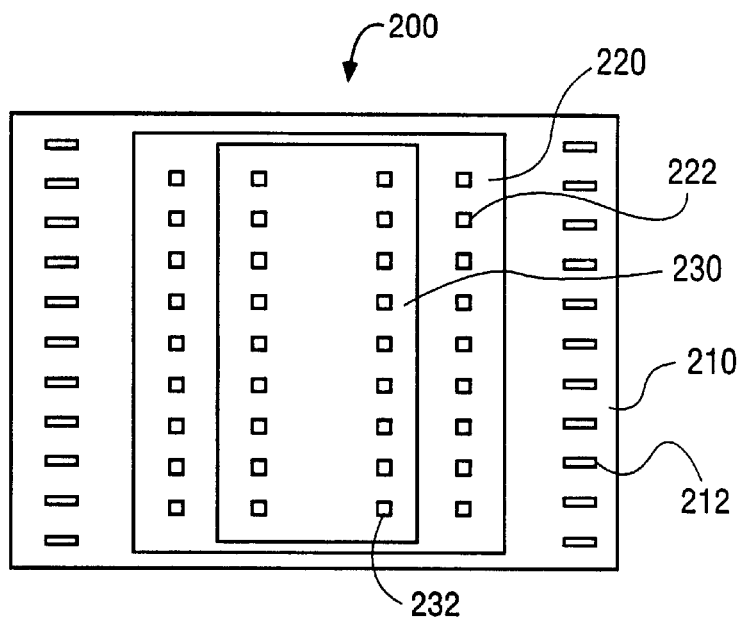
FIG. 3A is a top plan view of a prior art stacked dice configuration.
Figure 3B:
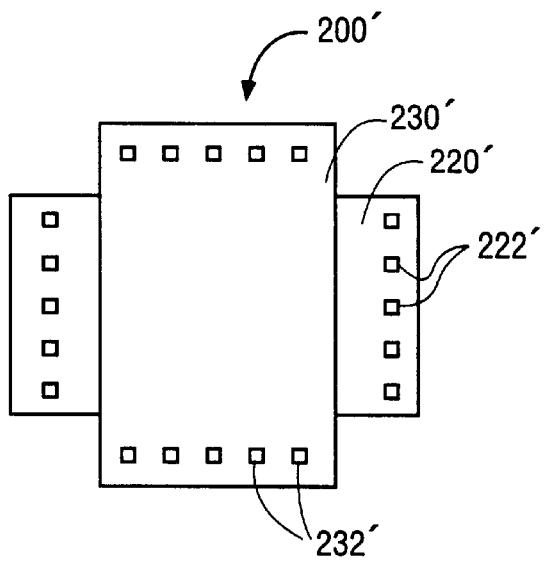
FIG. 3B is a top plan view of another prior art stacked dice configuration.

It is not necessary, however, for the upper die to cover any of the non-bonding edge areas. The configuration of the keep out areas next to adjacent edges of the lower die thus provides flexibility in the design of stacked chip packages because the size of the upper die is not limited by the bond pad configuration of the lower die as is the case in packages such as those shown in FIGS. 1–3.

Figure 7:
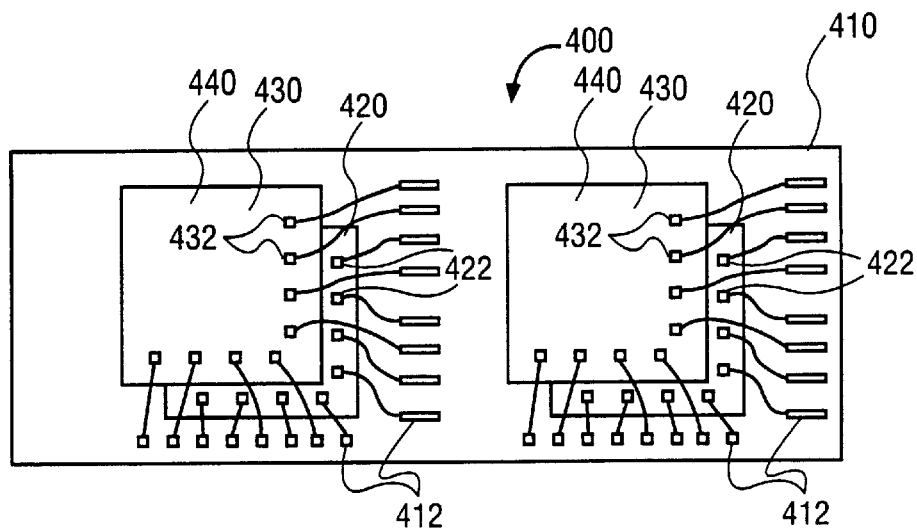
FIG. 7 is a top plan view of another embodiment of stacked IC dice mounted on a substrate.

FIG. 7 shows another embodiment of an IC package 400 that includes stacked dice as previously described. In the embodiment shown in FIG. 7, a substrate 410 is rectangular and includes space for two die sets 440. Substrate 410 has bond fingers 412 arranged similarly to previously described embodiments. Bond fingers 412 are arranged such that lower die 420 and upper die 430 having bond pads 422 and 432, respectively, are oriented such that bond pads of the die set 440 correspond to bond fingers 412. Substrate 410 can accommodate multiple die sets. Alternatively, substrate 410 can be another IC die and bond fingers 412 can be bond pads.

Figure 8:
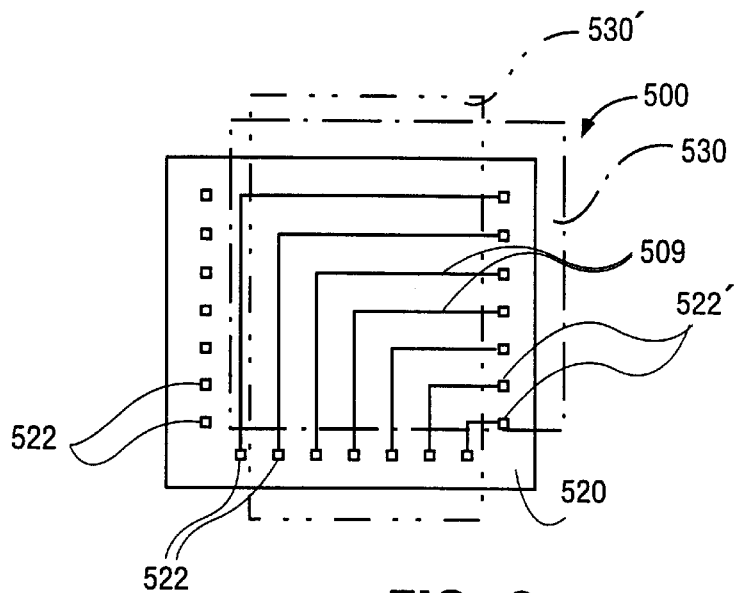
FIG. 8 is a top plan view of an embodiment of a die.

The adjacent edge bond pad configuration described herein can be used with conventional packaging by putting bond pads on three sides of the die as shown in FIG. 8. FIG. 8 shows an embodiment of an IC package 500 in which lower die 520 has bond pads 522 near two adjacent edges and bond pads 522' near a third edge. Traces 509 connect bond pads 522 to adjacent side bond pads 522'. Thus, die 520 can accept an upper die 530 in the offset manner as previously described with respect to the embodiments of FIGS. 4–6. Alternatively, lower die 520 can accept an upper die 530' that fits between the keep out areas of the sets of bond pads 522 and 522' that are near opposing edges of the lower die 520.

Figure 9:
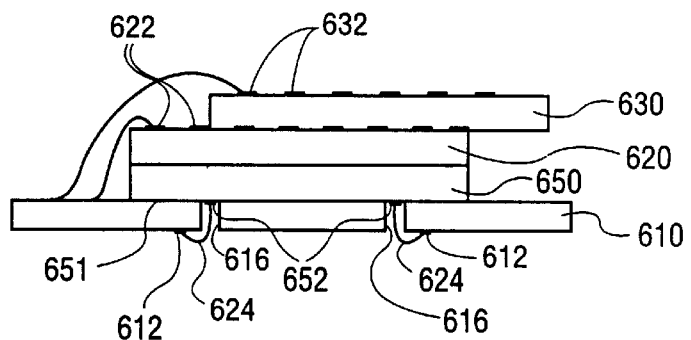
FIG. 9 is a side elevational view of another embodiment of stacked IC dice.
Figure 10:
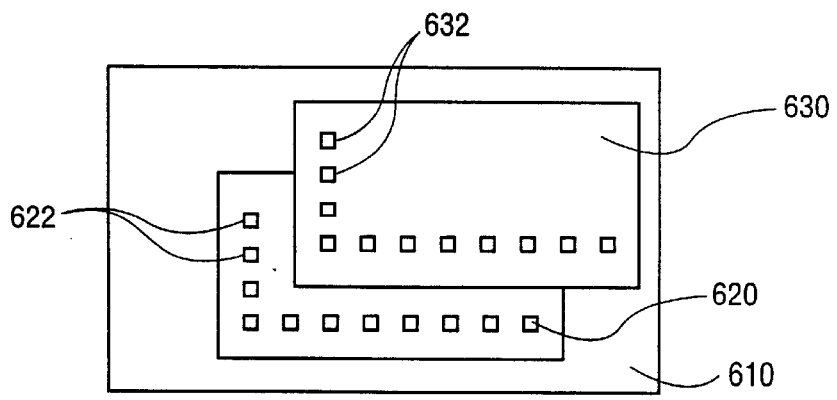
FIG. 10 is a top plan view of the stacked IC dice of FIG. 9.

FIGS. 9 and 10 show another embodiment of an IC package 600 in which an upper die 630 is stacked onto a lower die 620 in a manner similar to that of previously described embodiments shown in FIGS. 4–6. Lower die 620 has bond pads 622 near two adjacent edges, and upper die 630 has bond pads 632 near two adjacent edges. Upper die 630 is stacked on lower die 620 such that bond pads 622 are exposed for wire bonding to bond fingers (not shown) on substrate 610.

Referring to FIG. 9, lower die 620 and upper die 630, being stacked in an offset manner as shown in FIG. 10, are further stacked onto a bottom die 650. Bottom die 650 is mounted onto substrate 610 with its top surface 651 facing down toward substrate 610. Bottom die 650 has bond pads 652 on its top surface 651. Bond pads 652 provide electrical connection between bottom die 650 and substrate 610. Electrical connection is provided through wires 624 that extend through holes 616. Wires 624 are connected between bond pads 652 on bottom die 650 and bond fingers 612 on substrate 610.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit device comprising:

a lower die having a top surface and a bottom surface, the top surface facing away from a substrate, only and two adjacent keep out areas on the top surface, the keep out areas being next to two adjacent bonding edges of the lower die, the lower die further including at least one non-bonding edge area; and an upper die having one or more bonding edges stacked directly on the lower die such that a bottom surface of the upper die is adjacent to the top surface of the lower die, and such that a least one of the one or more bonding edges of the upper die is oriented toward at least one of the two adjacent bonding edges of the lower die, and such that the two adjacent keep out areas are exposed to accept wire bonds.

2. The integrated circuit device of claim 1 wherein the upper die covers the at least one non-bonding edge area.

3. The integrated circuit device of claim 1 wherein the lower die has two adjacent non-bonding edge areas.

4. The integrated circuit device of claim 3 wherein the upper die covers at least one of the two adjacent non-bonding edge areas.

5. The integrated circuit device of claim 1 wherein the substrate has one or more bond fingers, and wherein the lower die has one or more bond pads on the adjacent keep out areas, the bond fingers arranged on the substrate to correspond to the bond pads when the lower die is mounted on the substrate.

6. An integrated circuit device comprising:

a lower die having a top surface and a bottom surface, the top surface facing away from a substrate, and keep out areas on the top surface, the keep out areas being next to only two adjacent edges of the lower die, the lower die having bond pads only within the keep out areas; and an upper die stacked directly on the top surface of the lower die such that a bottom surface of the upper die is adjacent to the top surface of the lower die to avoid the keep out areas such that the bond pads of the lower die are exposed to accept bond wires.

7. The integrated circuit device of claim 6 wherein the upper die includes two adjacent bonding edges and has bond pads next to each of the two adjacent bonding edges, the upper die being oriented on the lower die such that the bonding edges of the upper die are oriented toward the keep out areas of the lower die.

8. The integrated circuit device of claim 6 wherein the upper die has bond pads near at least two adjacent edges oriented toward the keep out areas of the lower die.

9. The integrated circuit device of claim 7 wherein the upper die covers substantially all of the top surface of the lower die except the keep out areas.

10. The integrated circuit device of claim 9 wherein the upper die is larger than the lower die in at least one horizontal direction, and wherein a portion of the upper die overhangs the lower die.

11. The integrated circuit device of claim 6 wherein the substrate has one or more bond fingers that correspond to the bond pads on the lower die when the lower die is mounted on the substrate.

* * * * *

UNITED STATES PATENT AND TRADEMARK OFFICE
CERTIFICATE OF CORRECTION

PATENT NO. : 6,605,875 B2
DATED : August 12, 2003
INVENTOR(S) : Eskildsen

It is certified that error appears in the above-identified patent and that said Letters Patent is hereby corrected as shown below:

Column 7,
Line 26, delete "only and" and insert -- and only --.
Line 34, delete "a" and insert -- at --.

Signed and Sealed this

Second Day of December, 2003

JAMES E. ROGAN
*Director of the United States Patent and Trademark Office*